(12) United States Patent
Liu et al.

(10) Patent No.: US 10,546,911 B2
(45) Date of Patent: Jan. 28, 2020

(54) ORGANIC LIGHT-EMITTING DISPLAY PANEL AND ELECTRONIC DEVICE

(71) Applicant: SHANGHAI TIANMA AM-OLED CO., LTD., Shanghai (CN)

(72) Inventors: Haimin Liu, Shanghai (CN); Liyuan Liu, Shanghai (CN); Lijing Han, Shanghai (CN); Xue Wang, Shanghai (CN)

(73) Assignee: SHANGHAI TIANMA AM-OLED CO., LTD., Shanghai (CN)

(*) Notice: Subject to any disclaimer, the term of this patent is extended or adjusted under 35 U.S.C. 154(b) by 0 days.

(21) Appl. No.: 16/203,640

(22) Filed: Nov. 29, 2018

(65) Prior Publication Data
US 2019/0096983 A1 Mar. 28, 2019

(30) Foreign Application Priority Data
Jun. 28, 2018 (CN) .......................... 2018 1 0686183

(51) Int. Cl.
*H01L 27/32* (2006.01)
*H01L 51/50* (2006.01)
*H01L 51/52* (2006.01)

(52) U.S. Cl.
CPC ...... *H01L 27/3276* (2013.01); *H01L 27/3213* (2013.01); *H01L 27/3216* (2013.01);
(Continued)

(58) Field of Classification Search
CPC ............ H01L 27/3276; H01L 27/3213; H01L 27/3216; H01L 27/3218; H01L 27/3288;
(Continued)

(56) References Cited

U.S. PATENT DOCUMENTS

2005/0270257 A1* 12/2005 Shin ...................... G09G 3/3275
345/76
2017/0125736 A1* 5/2017 Kim .................... H01L 51/5036
(Continued)

FOREIGN PATENT DOCUMENTS

CN 107482038 A 12/2017

*Primary Examiner* — Zandra V Smith
*Assistant Examiner* — Andre C Stevenson
(74) *Attorney, Agent, or Firm* — Kilpatrick Townsend & Stockton, LLP

(57) ABSTRACT

Provided is an organic light-emitting display panel including gate lines, data lines intersecting with gate lines in an insulation manner, pins located in pin region; and sub-pixel units, each including cathode layer; an anode layer, and light-emitting layer between cathode layer and anode layer. The sub-pixel units include first to sixth sub-pixel units. The first to third sub-pixel units emit light with different colors. The fourth to sixth sub-pixel units emit light with different colors. The first and fourth sub-pixel units emit light with same color. A distance between first sub-pixel unit and pin region is larger than a distance between fourth sub-pixel unit and pin region. A distance between cathode layer of first sub-pixel unit and anode layer of first sub-pixel unit is larger than a distance between cathode layer of fourth sub-pixel unit and anode layer of fourth sub-pixel unit is a fourth distance.

13 Claims, 7 Drawing Sheets

(52) U.S. Cl.
CPC ...... *H01L 27/3218* (2013.01); *H01L 27/3288* (2013.01); *H01L 51/5012* (2013.01); *H01L 51/5056* (2013.01); *H01L 51/5072* (2013.01); *H01L 51/5092* (2013.01); *H01L 51/5206* (2013.01); *H01L 51/5221* (2013.01); *H01L 51/5265* (2013.01); *H01L 2251/558* (2013.01)

(58) Field of Classification Search
CPC ............ H01L 51/5012; H01L 51/5056; H01L 51/5072; H01L 21/5092; H01L 51/5206; H01L 51/5221; H01L 51/5265; H01L 2251/558
See application file for complete search history.

(56) References Cited

U.S. PATENT DOCUMENTS

2018/0083226 A1\* 3/2018 Ichikawa ............. H01L 27/322
2018/0122870 A1\* 5/2018 Park ................... H01L 51/5044

\* cited by examiner

ORGANIC LIGHT-EMITTING DISPLAY PANEL AND ELECTRONIC DEVICE

CROSS-REFERENCE TO RELATED APPLICATIONS

The present disclosure claims priority to Chinese Patent Application No. 201810686183.5, filed on Jun. 28, 2018, the content of Which is incorporated herein by reference in its entirety.

FIELD

The present disclosure relates to the field of display technologies, and in particular, to an organic light-emitting display panel and an electronic device.

BACKGROUND

With the rapid development of the flat panel display technology, an Organic Light Emitting Display (OLED for short) has more and more applications due to its excellent characteristics such as self-luminescence, high brightness, wide viewing angle, and rapid response.

The light-emitting devices of the current OLED display panel basically adopt a layered structure. A light-emitting device has a basic structure formed by an anode, an organic function layer, and a cathode. The organic function layer includes a light-emitting layer and other light-emitting auxiliary layers. The electronic elements such as signal lines and circuits in the OLED display panel provide signals to the light-emitting devices, so that the OLED display panel can emit light autonomously.

However, in the related art, since the electronic elements may have electrical loss in signal transmission, brightness of a light-emitting device far from a signal providing terminal would be lower than brightness of a light-emitting device closer to the signal providing terminal, thereby affecting the chromaticity uniformity of the OLED display panel, especially leading to the poor chromaticity uniformity at a front view in a white image state.

SUMMARY

The present disclosure provides an organic light-emitting display panel and an electronic device, which can adjust a cavity length of a light-emitting device of a sub-pixel unit according to a distance between an electronic component and a signal providing terminal, thereby solving the problem of poor chromaticity uniformity of the OLED display panel in the related art.

According to one embodiment of the present disclosure, an organic light-emitting display panel is provided. The organic light-emitting display panel includes: a plurality of gate lines; a plurality of data lines intersecting with the plurality of gate lines in an insulation manner; a plurality of pins located in a pin region; and a plurality of sub-pixel units, each of the plurality of sub-pixel units including a cathode layer; an anode layer; and a light-emitting layer located between the cathode layer and the anode layer. The plurality of sub-pixel units includes a first sub-pixel unit, a second sub-pixel unit, a third sub-pixel unit, a fourth sub-pixel unit, a fifth sub-pixel unit, and a sixth sub-pixel unit. The first sub-pixel unit, the second sub-pixel unit and the third sub-pixel unit emit light with different colors, and the fourth sub-pixel unit, the fifth sub-pixel unit and the sixth sub-pixel unit emit light with different colors. The first sub-pixel unit and the fourth sub-pixel unit emit light with a same color, and a distance between the first sub-pixel unit and the pin region is larger than a distance between the fourth sub-pixel unit and the pin region. A distance between the cathode layer of the first sub-pixel unit and the anode layer of the first sub-pixel unit is a first distance, a distance between the cathode layer of the fourth sub-pixel unit and the anode layer of the fourth sub-pixel unit is a fourth distance, and the first distance is larger than the fourth distance.

According to another embodiment of the present disclosure, an electronic device is provided. The electronic device includes the organic light-emitting display panel according to one embodiment of the present disclosure.

BRIEF DESCRIPTION OF DRAWINGS

According to embodiments of the present disclosure, the accompanying drawings used in the embodiments and in the related art are introduced as follows.

DESCRIPTION OF EMBODIMENTS

The embodiments of the present disclosure are described in the following with reference to the accompanying drawings. It should be understood that the described embodiments are merely exemplary embodiments of the present disclosure, which shall not be interpreted as providing limitations to the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

Figure 1:
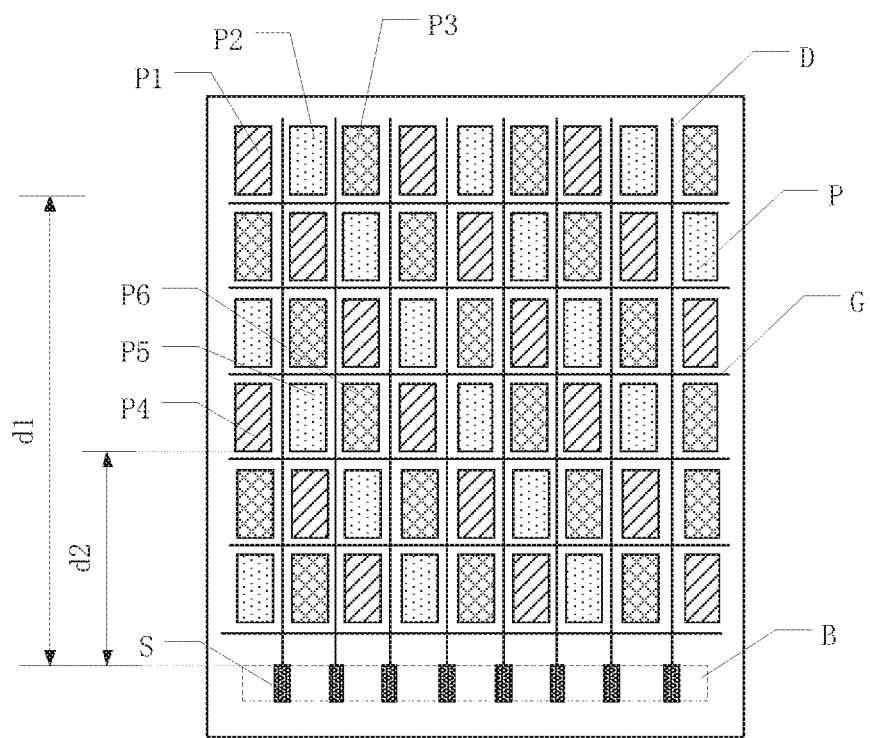
FIG. 1 is a top view of an organic light-emitting display panel according to an embodiment of the present disclosure.

The present disclosure provides an organic light-emitting display panel 100. As shown in FIG. 1, the organic light-emitting display panel 100 includes a plurality of gate lines G and a plurality of data lines D. The data lines D intersect with the gate lines G in an insulation manner.

With further reference to FIG. 1, the organic light-emitting display panel 100 further includes a plurality of pins S located within a pin region B. The plurality of pins S is electrically connected to the plurality of data lines D of the organic light-emitting display panel 100. The pins S may be electrically connected, by way of bonding, to pins of a chip (IC), pins of a flexible circuit board including a chip (IC), or pins of a printed circuit board including a chip (IC). The chip provides a display signal to the data lines D through the pins S.

With further reference to FIG. 1, the organic light-emitting display panel 100 further includes a plurality of sub-pixel units P, and the plurality of sub-pixel units P includes a first sub-pixel unit P1, a second sub-pixel unit P2, and a third sub-pixel unit P3. The first sub-pixel unit P1, the second sub-pixel unit P2, and the third sub-pixel unit P3 emit light with different colors. Each of the first sub-pixel unit P1, the second sub-pixel unit P2, and the third sub-pixel unit P3 can be a red sub-pixel unit, a blue sub-pixel unit, a green sub-pixel, a yellow sub-pixel unit, or a white sub-pixel unit. The sub-pixel units P further include a fourth sub-pixel unit P4, a fifth sub-pixel unit P5, and a sixth sub-pixel unit P6. The fourth sub-pixel unit P4, the fifth sub-pixel unit P5, and the sixth sub-pixel unit P6 emit light with different colors. Each of the fourth sub-pixel unit P4, the fifth sub-pixel unit P5, and the sixth sub-pixel unit P6 can be a red sub-pixel unit, a blue sub-pixel unit, a green sub-pixel, a yellow sub-pixel unit, or a white sub-pixel unit. The first sub-pixel unit P1 and the fourth sub-pixel unit P4 emit light with a same color. A distance between the first sub-pixel unit P1 and the pin region B is d1, and a distance between the fourth sub-pixel unit P4 and the pin region B is d2, where d1 is larger than d2.

Figure 2:
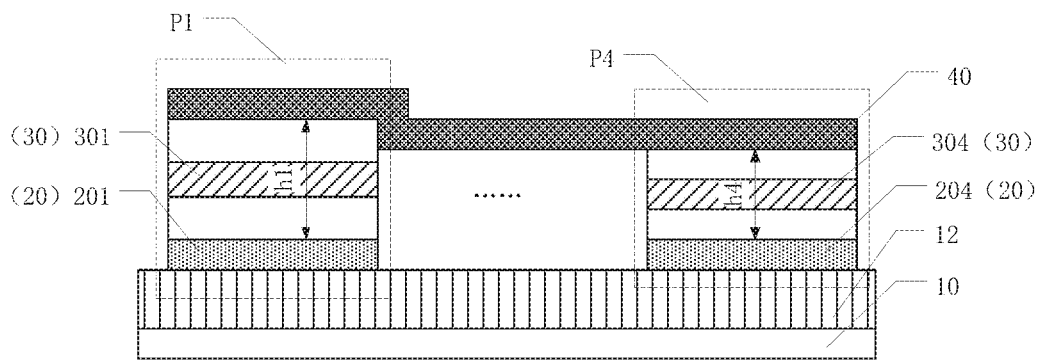
FIG. 2 is a schematic diagram illustrating a layered structure of light-emitting devices of a first sub-pixel unit and a fourth sub-pixel unit of FIG. 1 according to an embodiment of the present disclosure.

With reference to FIG. 1 and FIG. 2, the organic light-emitting display panel 100 further includes a substrate 10, a driving function layer 12, an anode layer 20, a light-emitting layer 30, and a cathode layer 40. The driving function layer 12 includes gate lines G, data lines D, and a driving device. The driving device can be a thin film transistor (TFT). The cathode layer 40, the anode layer 20, and the light-emitting layer 30 constitute a basic structure of the organic light-emitting device. The organic light-emitting device can further include an auxiliary function layer other than the cathode layer 40, the anode layer 20, and the light-emitting layer 30. The anode layer 20 and the cathode layer 40 each may be formed as a multi-layer structure. A distance between the anode layer 20 and the cathode layer 40 is a cavity length of the organic light-emitting display device. In the organic light-emitting display panel 100 provided by this embodiment of the present disclosure, the cathode layer 40 may be formed as an entire layer, that is, the cathode layer 40 corresponding to the first sub-pixel unit P1 and the cathode layer 40 corresponding to the second sub-pixel unit P2 are formed continuously. The light-emitting device of the first sub-pixel unit P1 includes an anode layer 201, a light-emitting layer 301, and a corresponding cathode layer 40. The light-emitting device of the fourth sub-pixel unit P4 includes an anode layer 204, a light-emitting layer 304, and a corresponding cathode layer 40. A distance between the corresponding cathode layer 40 of the first sub-pixel unit P1 and the anode layer 201 of the first sub-pixel unit P1 is a first distance h1, that is, a cavity length of the organic light-emitting device of the first sub-pixel unit P1 is h1. A distance between the corresponding cathode layer 40 of the fourth sub-pixel unit P4 and the anode layer 204 of the first sub-pixel unit P4 is a fourth distance h4, that is, a cavity length of the organic light-emitting device of the fourth sub-pixel unit P4 is h4. The first distance h1 is larger than the fourth distance h4.

For another organic light-emitting display panel provided by an embodiment of the present disclosure, the distance h1 between the corresponding cathode layer 40 of the first sub-pixel unit P1 and the anode layer 20 of the first sub-pixel unit P1 and the distance h4 between the corresponding cathode layer 40 of the fourth sub-pixel unit P4 and the anode layer 20 of the fourth sub-pixel unit P4 are adjusted based on the distance between the first sub-pixel unit P1 and the pin region and the distance between the fourth sub-pixel unit P4 and the pin region, respectively. That is, the cavity distance h1 of the light-emitting device of the first sub-pixel unit P1 and the cavity distance h4 of the light-emitting device of the first sub-pixel unit P4 can achieve compensation for chromaticity unevenness between the first sub-pixel unit P1 and the fourth sub-pixel unit P4 that emit light of the same color, and can achieve uniformity with respect to the display chromaticity between the first sub-pixel unit P1 and the fourth sub-pixel unit P4. In the related art, signal loss caused by connecting the first sub-pixel unit P1 with an electronic device (e.g., the data lines D) is different from signal loss of connecting the fourth sub-pixel unit P4 with the electronic device (e.g., the data lines D). This may result in that the display chromaticity of the first sub-pixel unit P1 is different from the display chromaticity of the fourth sub-pixel unit P4. This can be solved by the configuration in the abovementioned embodiments. That is, the problem of poor chromaticity uniformity of the organic light-emitting display panel in the related art can be solved, and thus the display effect can be improved.

For another organic light-emitting display panel provided by an embodiment of the present disclosure, the distance h1 between the corresponding cathode layer 40 of the first sub-pixel unit P1 and the anode layer 20 of the first sub-pixel unit P1 is larger than the distance h4 between the corresponding cathode layer 40 of the fourth sub-pixel unit P4 and the anode layer 20 of the fourth sub-pixel unit P4. Meanwhile, for the second sub-pixel unit P2 and the fifth sub-pixel unit P5 which have different distances from the pin region B, it is adjusted that the distance between the corresponding cathode layer of the second sub-pixel unit P2 and the anode layer of the second sub-pixel unit P2 is larger than the distance between the corresponding cathode layer of the fifth sub-pixel unit P5 and the anode layer of the fifth sub-pixel unit P5.

Figure 3:
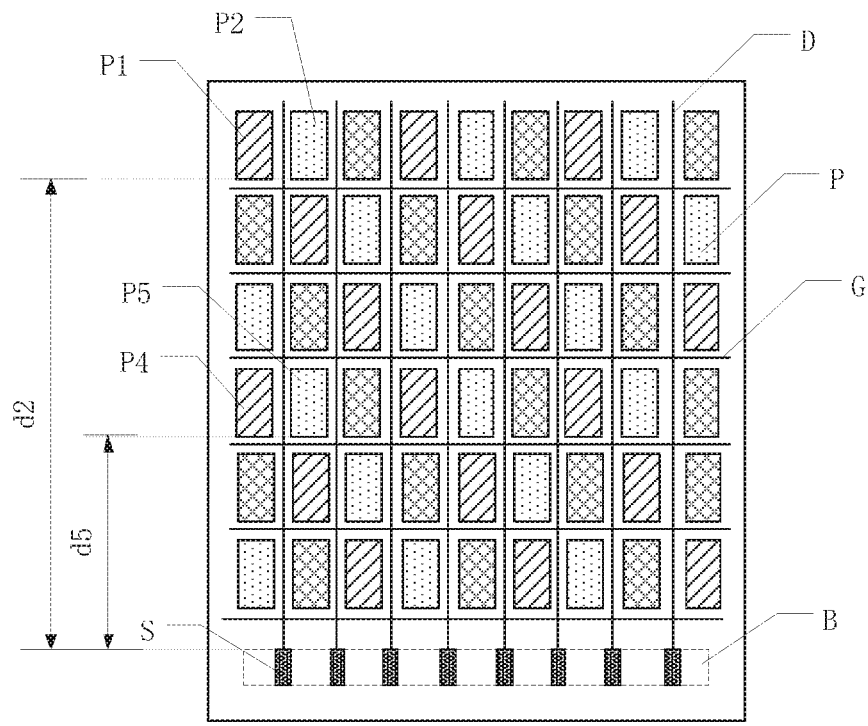
FIG. 3 is a top view of another organic light-emitting display panel according to an embodiment of the present disclosure.

As shown in FIG. 3, the second sub-pixel unit P2 and the fifth sub-pixel unit P5 of the organic light-emitting display panel 100 emit light with a same color. A distance between the second sub-pixel unit P2 and the pin region B is d2, and a distance between the fifth sub-pixel unit P5 and the pin region B is d5, where d2 is larger than d5.

Figure 4:
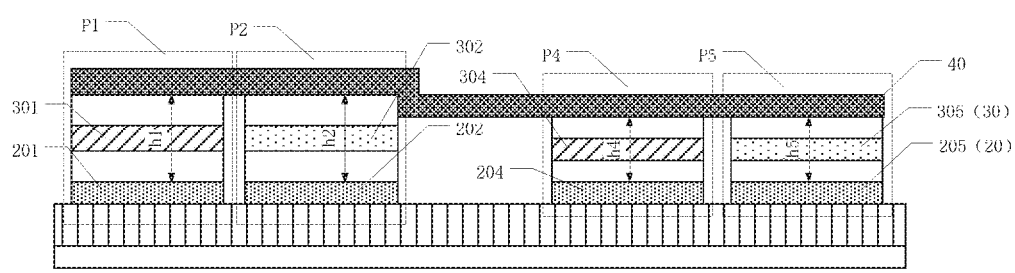
FIG. 4 is a schematic diagram illustrating a layered structure of light-emitting devices of a first sub-pixel unit, a second sub-pixel unit, a third sub-pixel unit and a fourth sub-pixel unit of FIG. 3 according to an embodiment of the present disclosure.

With reference to FIG. 3 and FIG. 4, the light-emitting device of the second sub-pixel unit P2 includes an anode layer 202, a light-emitting layer 302, and a corresponding cathode layer 40. The light-emitting device of the fifth sub-pixel unit P5 includes an anode layer 205, a light-emitting layer 305, and a corresponding cathode layer 40. For the organic light-emitting display panel 100 provided by this embodiment of the present disclosure, the cathode layer 40 may be formed as an entire layer, that is, the corresponding cathode layer 40 of the second sub-pixel unit P2 and the corresponding cathode layer 40 of the fifth sub-pixel unit P5 are formed continuously. The distance between the corresponding cathode layer 40 of the second sub-pixel unit P2 and the anode layer 202 of the second sub-pixel unit P2 is a second distance h2, that is, a cavity length of the organic light-emitting device of the second sub-pixel unit P2 is h2. The distance between the corresponding cathode layer 40 of the fifth sub-pixel unit P5 and the anode layer 205 of the fifth sub-pixel unit P5 is a fifth distance h5, that is, a cavity length of the organic light-emitting device of the fifth sub-pixel unit P5 is h5. The second distance h2 is larger than the fifth distance h5.

An embodiment of the present disclosure provides an organic light-emitting display panel, in which it can be adjusted that the first distance is larger than the fourth distance, and the second distance between the pin region and a second sub-pixel unit far from the pin region is larger than the fifth distance between pin region and a fifth sub-pixel unit closer to the pin region. This can precisely compensate sub-pixel units having two colors and with different distances from the pin region, thereby further improving the chromaticity uniformity of the OLED display panel.

An embodiment of the present disclosure further provides another organic light-emitting display panel, in which the distance h1 between the corresponding cathode layer 40 of the first sub-pixel unit P1 and the anode layer 20 of the first sub-pixel unit P1 is larger than the distance h4 between the corresponding cathode layer 40 of the fourth sub-pixel unit P4 and the anode layer 20 of the fourth sub-pixel unit P4, and the distance between the corresponding cathode layer of the second sub-pixel unit P2 and the anode layer of the second sub-pixel unit P2 is larger than the distance between the corresponding cathode layer of the fifth sub-pixel unit P5 and the anode layer of the fifth sub-pixel unit P5. Meanwhile, for the third sub-pixel unit P3 and the sixth sub-pixel unit P6 that have different distances from the pin region B, it can be adjusted that a distance between the corresponding cathode layer of the third sub-pixel unit P3 and the anode layer of the third sub-pixel unit P3 is larger than a distance between the corresponding cathode layer of the sixth sub-pixel unit P6 and the anode layer of the sixth sub-pixel unit P6.

Figure 5:
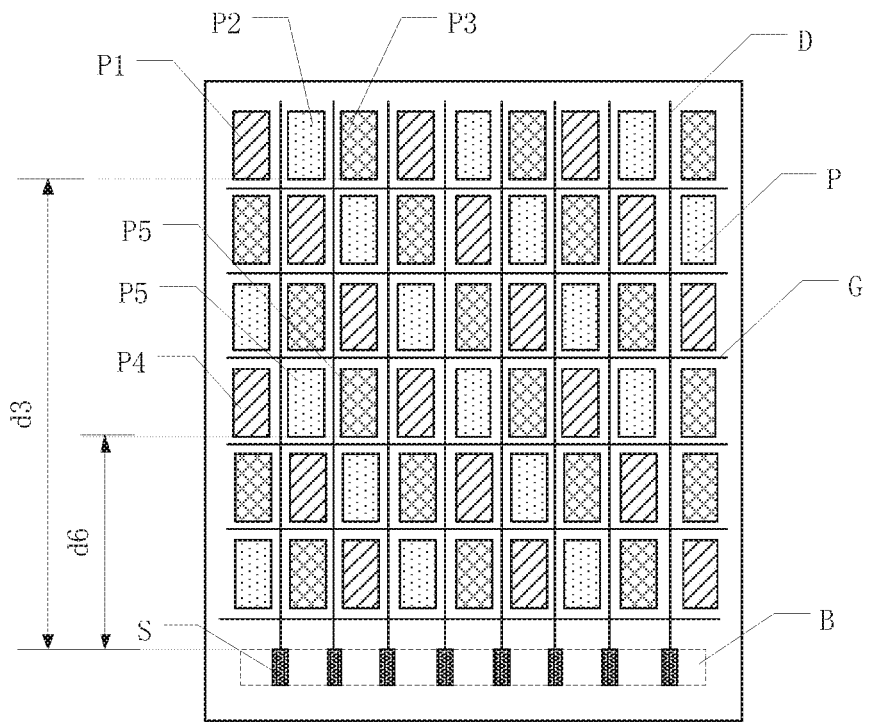
FIG. 5 is a top view of still another organic light-emitting display panel according to an embodiment of the present disclosure.

As shown in FIG. 5, the third sub-pixel unit P3 and the sixth sub-pixel unit P6 emit light with a same color. A distance between the third sub-pixel unit P3 and the pin region B is d3, and a distance between the sixth sub-pixel unit P6 and the pin region B is d6, where d3 is larger than d6.

Figure 6:
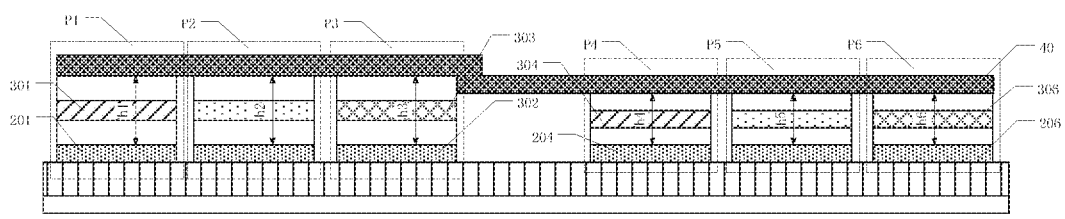
FIG. 6 is a schematic diagram illustrating a layered structure of light-emitting devices of a first sub-pixel unit, a second sub-pixel unit, a third sub-pixel unit, a fourth sub-pixel unit, a fifth sub-pixel unit and a sixth sub-pixel unit of FIG. 5 according to an embodiment of the present disclosure.

With reference to FIG. 5 and FIG. 6, the light-emitting device of the third sub-pixel unit P3 includes an anode layer 203, a light-emitting layer 303, and a corresponding cathode layer 40. The light-emitting device of the sub-pixel unit P6 includes an anode layer 206, a light-emitting layer 306, and a corresponding cathode layer 40. In the organic light-emitting display panel 100 provided by this embodiment of the present disclosure, the cathode layer 40 may be formed as an entire layer, that is, the corresponding cathode layer 40 of the third sub-pixel unit P3 and the corresponding cathode layer 40 of the sixth sub-pixel unit P6 are formed continuously. A distance between the corresponding cathode layer 40 of the third sub-pixel unit P3 and the anode layer 203 of the third sub-pixel unit P3 is a third distance h3, that is, a cavity length of the organic light-emitting device of the third sub-pixel unit P3 is h3. A distance between the corresponding cathode layer 40 of the sub-pixel unit P6 and the anode layer 206 of the sixth sub-pixel unit P6 is a sixth distance h6, that is, a cavity length of the organic light-emitting device of the sixth sub-pixel unit P6 is h6. The third distance h3 is larger than the sixth distance h6.

An embodiment of the present disclosure further provides an organic light-emitting display panel, in which it is adjusted in such a manner that the first distance is larger than the fourth distance and the second distance is larger than the fifth distance, and it is further adjusted that the third distance between the pin region and the third sub-pixel unit far from the pin region is larger than the sixth distance between the pin region and the sixth sub-pixel unit closer to the pin region. This can precisely compensate sub-pixel units having three colors and with different distances from the pin region, thereby further improving the chromaticity uniformity of the OLED display panel.

Figure 7:
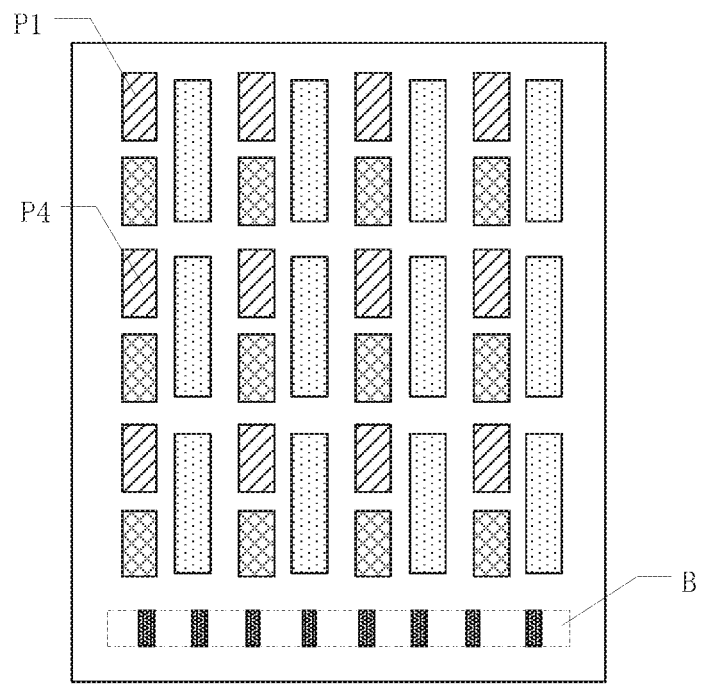
FIG. 7 is a top view of yet another organic light-emitting display panel according to an embodiment of the present disclosure.
Figure 8:
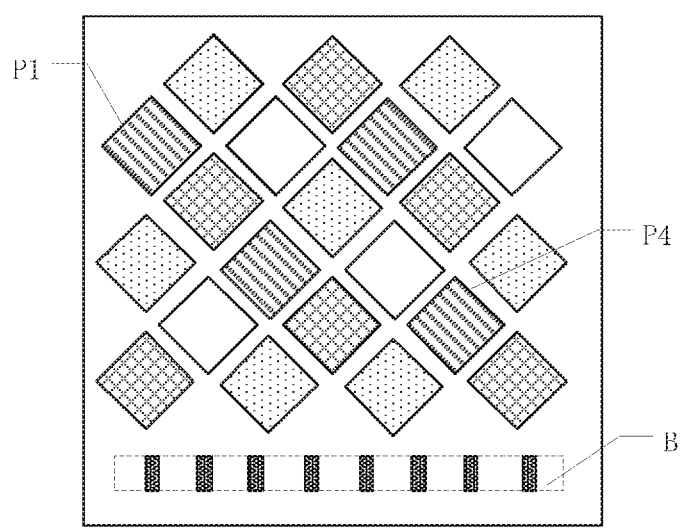
FIG. 8 is a top view of yet another organic light-emitting display panel according to an embodiment of the present disclosure.
Figure 9:
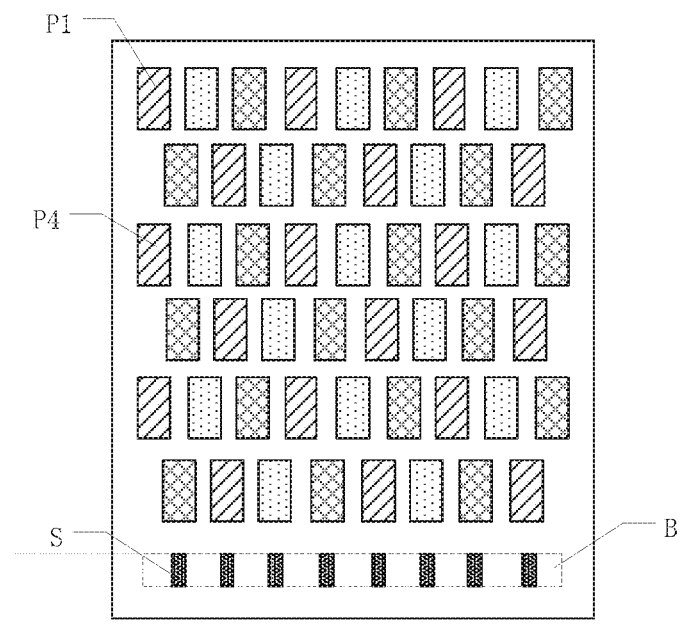
FIG. 9 is a top view of yet another organic light-emitting display panel according to an embodiment of the present disclosure.

The organic light-emitting display panel provided by the present disclosure is not limited to the pixel arrangement shown in the figures. In addition to the pixel arrangement shown in the figures, the pixel arrangement may also be a square-shape arrangement, a π-shape arrangement, a rhombus-shape arrangement, a triangle arrangement, etc. As shown in FIG. 7, FIG. 8, and FIG. 9, as long as the distance between the first sub-pixel unit P1 and the pin region B is larger than the distance between the fourth sub-pixel unit P4 and the pin region B (the first sub-pixel unit P1 and the fourth sub-pixel unit P4 emit light with a same color), it can be set in such a manner that the distance between the corresponding cathode layer of the first sub-pixel unit P1 and the anode layer of the first sub-pixel unit P1 is larger than the distance between the corresponding cathode layer of the fourth sub-pixel unit P4 and the anode layer of the fourth sub-pixel unit P4.

It should be understand that the organic light-emitting display panel provided by the present disclosure is applicable to all kinds of pixel arrangements, which shall fall within the scope of the embodiments of the present disclosure, as long as the display chromaticity of each sub-pixel unit that emits light with a same color and has a different distance from the pin region B can be achieved by adjusting the distance between the cathode corresponding to the light-emitting device of the sub-pixel and the anode of the light-emitting device of this sub-pixel.

An embodiment of the present disclosure further provides another display panel, in which the first distance and the fourth distance can be regionally adjusted. That is, all first sub-pixel units within a first region have a same first distance, and all fourth sub-pixel units within a second region have a same fourth distance. A distance between the first region and the pin region is larger than a distance between the second region and the pin region, and the first distance is larger than the fourth distance.

Figure 10:
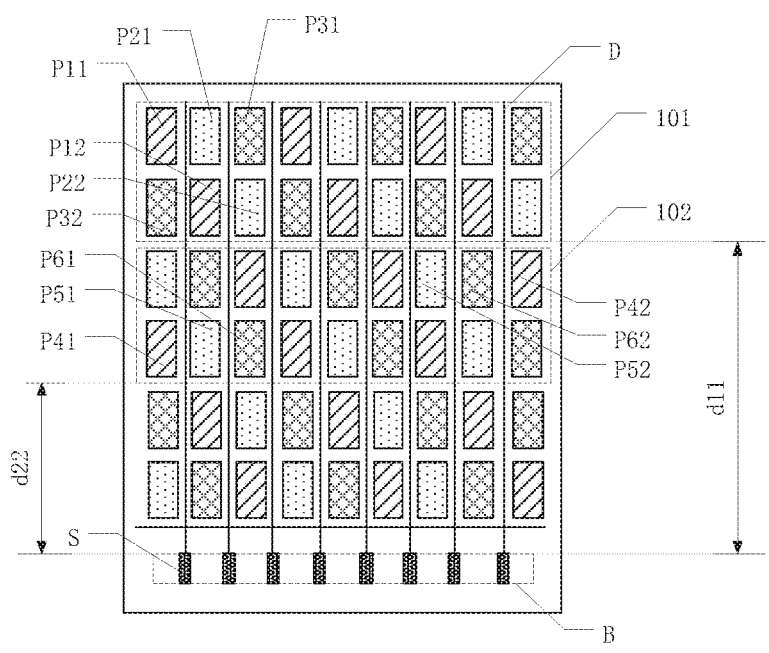
FIG. 10 is a top view of yet another organic light-emitting display panel according to an embodiment of the present disclosure.

As shown in FIG. 10, the organic light-emitting display panel 100 includes a first region 101 and a second region 102. A distance d11 between the first region 101 and the pin region B is larger than a distance d22 between the second region 102 and the pin region B. The first sub-pixel unit P1, the second sub-pixel unit P2, and the third sub-pixel unit P3 are located within the first region 101. The fourth sub-pixel unit P4, the fifth sub-pixel unit P5, and the sixth sub-pixel unit P6 are located within the second region 102.

Figure 11:
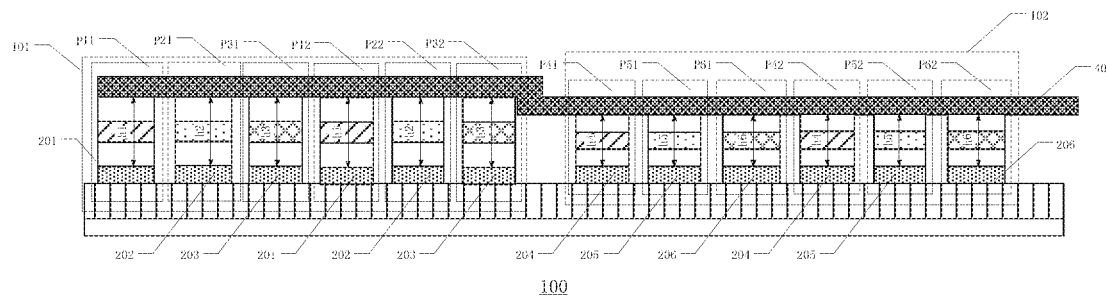
FIG. 11 is a schematic diagram illustrating a layered structure of light-emitting devices of a first sub-pixel unit, a second sub-pixel unit, a third sub-pixel unit, a fourth sub-pixel unit, a fifth sub-pixel unit and a sixth sub-pixel unit of FIG. 10 according to an embodiment of the present disclosure.

With reference to FIG. 10 and FIG. 11, the first region 101 includes at least two first sub-pixel units P11 and P12. The distance h1 between the corresponding cathode layer 40 of the first sub-pixel unit P11 and the anode layer 201 of the first sub-pixel unit P11 is equal to the distance h1 between the corresponding cathode layer 40 of the first sub-pixel unit P12 and the anode layer 201 of the first sub-pixel unit P12. That is, the first sub-pixel units P11 and P12 have a same first distance h1.

In the second region 102, the second region 102 includes at least two fourth sub-pixel units P41 and P42. The distance h4 between the corresponding cathode layer 40 of the fourth sub-pixel unit P41 and the anode layer 204 of the fourth sub-pixel unit P41 is equal to the distance h4 between the corresponding cathode layer 40 of the fourth sub-pixel unit P42 and the anode layer 204 of the fourth sub-pixel unit P42. That is, the fourth sub-pixel units P41 and P42 have a same fourth distance h4.

Further, for sub-pixel units with other colors within the first region, the cavity length of the organic light-emitting device of each sub-pixel unit with a same color can also be set to the same. With further reference to FIG. 10 and FIG. 11, the first region 101 includes at least two second sub-pixel units P21 and P22. The distance h2 between the corresponding cathode layer 40 of the second sub-pixel unit P21 and the anode layer 202 of the second sub-pixel unit P21 is equal to the distance h2 between the corresponding cathode layer 40 of the second sub-pixel unit P22 and the anode layer 202 of the second sub-pixel unit P22. That is, the second sub-pixel units P21 and P22 have a same second distance h2.

The first region 101 further includes at least two third sub-pixel units P31 and P32. The distance h3 between the corresponding cathode layer 40 of the third sub-pixel unit P31 and the anode layer 203 of the third sub-pixel unit P31 is equal to the distance h3 between the corresponding cathode layer 40 of the third sub-pixel unit P32 and the anode layer 203 of the third sub-pixel unit P32. That is, the third sub-pixel units P31 and P32 have a same third distance h3.

Further, for sub-pixel units with other colors within the second region, the cavity length of the organic light-emitting device of each sub-pixel unit with a same color can also be set to the same. With further reference to FIG. 10 and FIG. 11, the second region 102 includes at least two fifth sub-pixel units P51 and P52. The distance h5 between the corresponding cathode layer 40 of the fifth sub-pixel unit P51 and the anode layer 205 of the fifth sub-pixel unit P51 is equal to the distance h5 between the corresponding cathode layer 40 of the fifth sub-pixel unit P52 and the anode layer 205 of the fifth sub-pixel unit P52. That is, the fifth sub-pixel units P51 and P52 have a same fifth distance h5.

The second region 102 further includes at least two sixth sub-pixel units P61 and P62. The distance h6 between the corresponding cathode layer 40 of the sixth sub-pixel unit P61 and the anode layer 206 of the sixth sub-pixel unit P61 is equal to the distance h6 between the corresponding cathode layer 40 of the sixth sub-pixel unit P62 and the anode layer 206 of the sixth sub-pixel unit P62. That is, the sixth sub-pixel units P61 and P62 have a same sixth distance h6.

An embodiment of the present disclosure provides an organic light-emitting display panel, which includes a first region and a second region that have different distances from the pin region. Each first sub-pixel unit and each fourth sub-pixel unit are respectively located within the first region and within the second region. Each first sub-pixel unit within the first sub-pixel unit can have a same first distance, and each fourth sub-pixel unit within the second region can have a same fourth distance. In this way, the organic light-emitting devices of all first sub-pixel units within the first region can be simultaneously manufactured, and the organic light-emitting devices of all fourth sub-pixel units within the second region can be simultaneously manufactured, thereby avoiding that different rows of sub-pixel units with a same color need to be manufactured separately and thus simplifying process steps and saving process costs.

By a scientific division of a first region, a second region, even a third region, a fourth region . . . and an $N^{th}$ region, the cavity length of the light-emitting device of each sub-pixel unit with a same color regionally changes, so that the chromaticity can be regionally compensated. In this way, the chromaticity uniformity of the OLED display panel can be improved while taking into account the difficulty of the process, thereby reducing the complexity of the process flow, simplifying the process steps, and reducing the production cost.

Similarly, the cavity lengths of the organic light-emitting devices of the second sub-pixel units within the first region are set to be equal to each other, the cavity lengths of the organic light-emitting devices of the third sub-pixel units within the first region are set to be equal to each other, the cavity lengths of the organic light-emitting devices of the fifth sub-pixel units within the second region are set to be equal to each other, and the cavity lengths of the organic light-emitting devices of the sixth sub-pixel units within the second region are set to be equal to each other. The cavity lengths of the light-emitting devices of the sub-pixel units with a same color are equal to each other within a same region. Meanwhile, for sub-pixel units with a same color, the cavity length of the organic light-emitting device of the sub-pixel unit within the first region is larger than the cavity length of the organic light-emitting device of the sub-pixel unit within the second region. In this way, the chromaticity uniformity of the OILED display panel can be improved while taking into account the difficulty of the process, thereby reducing the production cost.

Further, it is also possible to optimize the compensation gradient of the chromaticity with respect to different colors within a same region, and set the cavity lengths of the organic light-emitting devices of the sub-pixel units with different colors within a same region to be different.

Figure 12:
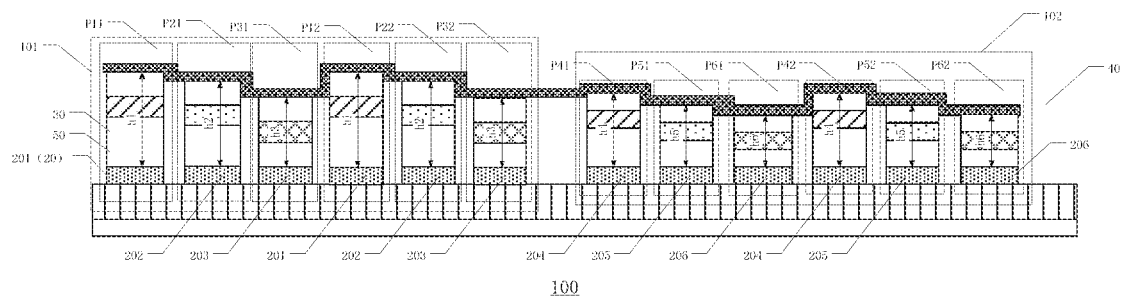
FIG. 12 is a schematic diagram illustrating another layered structure of light-emitting devices of a first sub-pixel unit, a second sub-pixel unit, a third sub-pixel unit, a fourth sub-pixel unit, a fifth sub-pixel unit and a sixth sub-pixel unit of FIG. 10 according to an embodiment of the present disclosure.

For the organic light-emitting display panel 100 provided by an embodiment of the present disclosure, as shown in FIG. 10 and FIG. 12, in the first region 101, the distance h1 between the corresponding cathode layer 40 of the first sub-pixel unit P11 or P12 and the anode layer 201 of the first sub-pixel unit P11 or P12 is larger than the distance h2 between the corresponding cathode layer 40 of the second sub-pixel unit P21 or P22 and the anode layer 202 of the second sub-pixel unit P21 or P22.

In the first region 101, the distance h2 between the corresponding cathode layer 40 of the second sub-pixel unit P21 or P22 and the anode layer 202 of the second sub-pixel unit P21 or P22 is larger than the distance h3 between the corresponding cathode layer 40 of the third sub-pixel unit P31 or P32 and the anode layer 203 of the third sub-pixel unit P31 or P32.

An embodiment of the present disclosure provides an organic light-emitting display panel 100, in which for the first sub-pixel unit P11 or P12, the second sub-pixel unit P21 or P22, and the third sub-pixel unit P31 or P32 within the first region 101 that emit light with different colors, the first distance h1 of the first sub-pixel unit P11 or P12, the second distance h2 of the second sub-pixel unit P21 or P22, and the third distance h3 of the third sub-pixel unit P31 or P32 can be set to be different from each other, so that the brightness and chromaticity of each color can be compensated in a gradient manner. In this way, the contrast of the OLED display panel can be improved while improving the chromaticity uniformity of the OLED display panel, thereby further improving the display effect.

Further, when adjusting the cavity lengths of the organic light-emitting devices of the sub-pixel units with different colors within the first region, the cavity lengths of the organic light-emitting devices of the sub-pixel units with different colors within the second region can also be adjusted, so as to achieve gradient compensation for sub-pixel units in the entire organic light-emitting display panel that have different colors.

For an organic light-emitting display panel 100 provided by an embodiment of the present disclosure, as shown in FIG. 10 and FIG. 12, within the second region 102, the distance h4 between the corresponding cathode layer 40 of the fourth sub-pixel units P41 or P42 and the anode layer 204 of the fourth sub-pixel unit P41 or P42 is larger than the distance h5 between the corresponding cathode layer 40 of the fifth sub-pixel unit P51 or P52 and the anode layer 205 of the fifth sub-pixel unit P51 or P52.

Within the second region 102, the distance h5 between the corresponding cathode layer 40 of the fifth sub-pixel units P51 or P52 and the anode layer 205 of the fifth sub-pixel unit P51 or P52 is larger than the distance h6 between the corresponding cathode layer 40 of the sixth sub-pixel unit P61 or P62 and the anode layer 206 of the sixth sub-pixel unit P61 or P62.

An embodiment of the present disclosure provides an organic light-emitting display panel 100, in which for the first sub-pixel unit P11 or P12, the second sub-pixel unit P21 or P22, and the third sub-pixel unit P31 or P32 within the first region 101 that emit light with different colors, the first distance h1 of the first sub-pixel unit P11 or P12, the second distance h2 of the second sub-pixel unit P21 or P22, and the third distance h3 of the third sub-pixel unit P31 or P32 can be set to be different from each other, so that the brightness and chromaticity of each color can be compensated in a gradient manner. In this way, the contrast of the OLED display panel can be improved while improving the chromaticity uniformity of the OLED display panel, thereby further improving the display effect.

An embodiment of the present disclosure provides an organic light-emitting display panel 100, in which for the fourth sub-pixel unit P41 or P42, the fifth sub-pixel unit P51 or P52, and the sixth sub-pixel unit P61 or P62 with the second region 102 that emit light with different colors, the fourth distance h4 of the fourth sub-pixel unit P41 or P42, the fifth distance h5 of the fifth sub-pixel unit P51 or P52, and the sixth distance h6 of the sixth sub-pixel unit P61 or P62 can be set to be different from each other, so that the brightness and chromaticity of each color can be compensated within the entire panel. In this way, the contrast of the OLED display panel can be improved while improving the chromaticity uniformity of the OLED display panel, thereby further improving the display effect.

Further, the cavity lengths of the light-emitting devices with different colors can be adjusted by a thickness of a compensation layer. In an embodiment, as shown in FIG. 12, the organic light-emitting display panel 100 includes a compensation layer 50. The compensation layer 50 is located between the light-emitting layer 30 and the anode 20. The compensation layer 50 of each sub-pixel unit can be manufactured by a device mask. Within the first region 101, a thickness of the compensation layer 501 of the first sub-pixel unit P11 or P12 is larger than a thickness of the compensation layer 502 of the second sub-pixel unit P21 or P22, and the thickness of the compensation layer 502 of the second sub-pixel unit P21 or P22 is larger than a thickness of the compensation layer 503 of the third sub-pixel unit P31 or P32.

An organic light-emitting display panel 100 provided by an embodiment of the present disclosure can adjust the first distance h1 of the first sub-pixel unit P11 or P12, the second distance h2 of the second sub-pixel unit P21 or P22, and the third distance h3 of the third sub-pixel unit P31 or P32 by adjusting the compensation layers respectively corresponding to the first sub-pixel unit P11 or P12, the second sub-pixel unit P21 or P22 and the third sub-pixel unit P31 or P32. In this way, the contrast of the OLED display panel can be improved while improving the chromaticity uniformity of the OLED display panel. Meanwhile, the difficulty of the process can be reduced and the production cost can be reduced.

Further, an organic light-emitting display panel 100 provided by an embodiment of the present disclosure can adjust the compensation layer of the fourth sub-pixel unit P41 or P42, the compensation layer of the fifth sub-pixel unit P51 or 52, and the compensation layer of the sixth sub-pixel unit P61 or 62 within second region 102, so as to adjust the cavity lengths of the light-emitting devices thereof.

With reference to FIG. 12, for an organic light-emitting display panel 100 provided by an embodiment of the present disclosure, within the second region 102, a thickness of the compensation layer 504 of the fourth sub-pixel unit P41 or P42 is larger than a thickness of the compensation layer 505 of the fifth sub-pixel unit P51 or P52, and the thickness of the compensation layer 505 of the fifth sub-pixel unit P51 or P52 is larger than a thickness of the compensation layer 506 of the sixth sub-pixel unit P61 or P62.

Further, in addition to a cathode layer, an anode layer, and a light-emitting layer, an organic light-emitting display panel provided by an embodiment of the present disclosure can further include other organic auxiliary function layers, such as a hole injection layer, a hole transport layer, an electron injection layer, an electron transport layer, and the like. The hole injection layer, the hole transport layer, the electron injection layer, and the electron transport layer can be manufactured by using a commonly used mask. The cavity length of the light-emitting device of each sub-pixel unit can be adjusted by adjusting any one or more of the hole injection layer, the hole transport layer, the electron injection layer, and the electron transport layer, so as to achieve chromaticity compensation.

Figure 13:
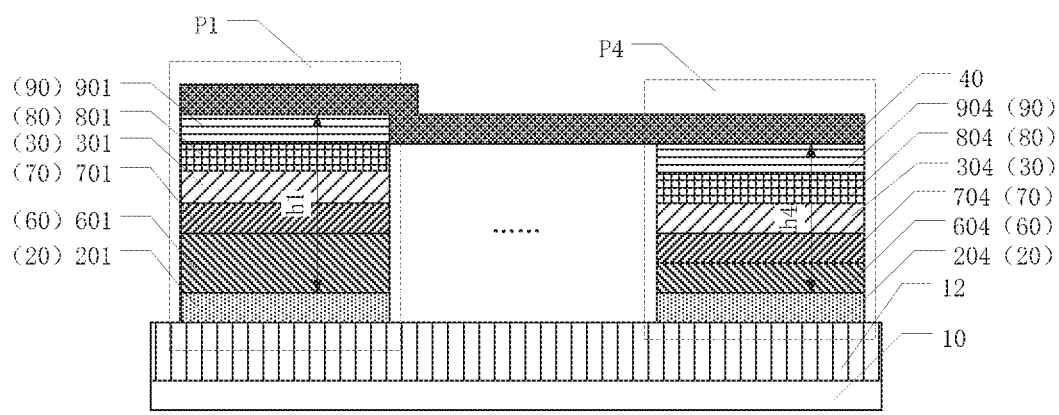
FIG. 13 is a schematic diagram illustrating a layered structure of light-emitting devices of a first sub-pixel unit and a fourth sub-pixel unit of another organic light-emitting display panel according to an embodiment of the present disclosure.

With reference to FIG. 1 and FIG. 13, the organic light-emitting display panel 100 further includes a hole injection layer 60, a hole transport layer 70, an electron transport layer 80, and an electron injection layer 90. The light-emitting device of the first sub-pixel unit P1 includes an anode layer 201, a hole injection layer 601, a hole transport layer 701, a compensation layer 501, a light-emitting layer 301, an electron transport layer 801, an electron injection layer 901, and a corresponding cathode layer 40. The light-emitting device of the fourth sub-pixel unit P4 includes an anode layer 204, a hole injection layer 604, a hole transport layer 704, a compensation layer 504, a light-emitting layer 304, an electron transport layer 804, an electron injection layer 904, and a corresponding cathode layer 40.

As shown in FIG. 13, a thickness of the hole injection layer 601 of the first sub-pixel P1 is larger than a thickness of the hole injection layer 604 of the fourth sub-pixel unit P4. Therefore, the distance h1 between the corresponding cathode layer 40 of the first sub-pixel unit P1 and the anode layer 201 of the first sub-pixel unit P1 is larger than the fourth distance h4 between the corresponding cathode layer 40 of the fourth sub-pixel unit P4 and the anode layer 204 of the fourth sub-pixel unit P4.

It should be understood that in another embodiment of the present disclosure, it is possible to set that a thickness of the hole transport layer 701 of the first sub-pixel unit P1 is larger than a thickness of the hole transport layer 704 of the fourth sub-pixel unit P4, so that the distance h1 between the corresponding cathode layer 40 of the first sub-pixel unit P1 and the anode layer 201 of the first sub-pixel unit P1 is larger than the fourth distance h4 between the corresponding cathode layer 40 of the fourth sub-pixel unit P4 and the anode layer 204 of the fourth sub-pixel unit P4.

In another embodiment of the present disclosure, it is possible to set that the thickness of the hole injection layer 601 of the first sub-pixel unit P1 is larger than the thickness of the hole injection layer 604 of the fourth sub-pixel unit P4, and the thickness of the hole transport layer 701 of the first sub-pixel unit P1 is larger than the thickness of the hole transport layer 704 of the fourth sub-pixel unit P4.

In another embodiment of the present disclosure, it is possible to adjust other auxiliary function layers alone or adjust other auxiliary function layers in combination, so as to adjust the cavity lengths of the light-emitting devices of the first sub-pixel unit P11 or P12 and the fourth sub-pixel unit P41 or P42.

An organic light-emitting display panel 100 provided by an embodiment of the present disclosure can adjust the cavity lengths of the light-emitting devices of the first sub-pixel unit P11 or P12 and the fourth sub-pixel unit P41 or 42 by adjusting thicknesses of the electron transport layer 80 and the electron injection layer 90.

Figure 14:
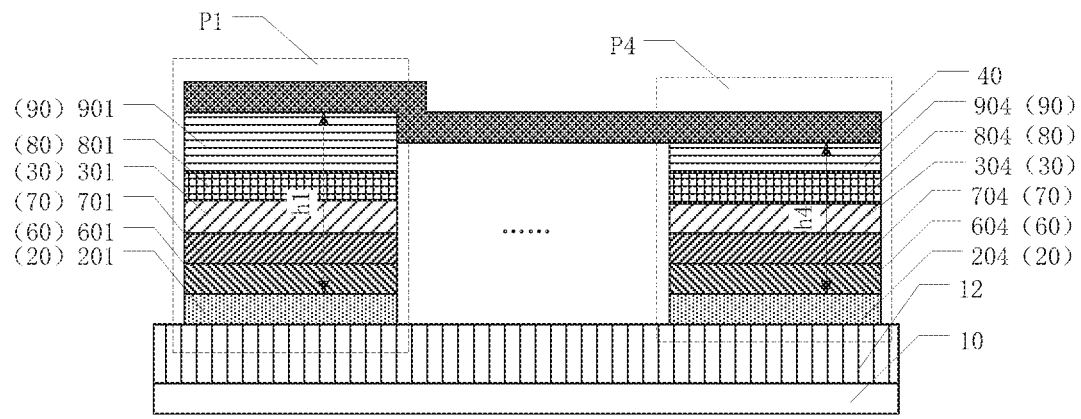
FIG. 14 is a schematic diagram illustrating a layered structure of light-emitting devices of a first sub-pixel unit and a fourth sub-pixel unit of still another organic light-emitting display panel according to an embodiment of the present disclosure.

As shown in FIG. 14, a thickness of the electron injection layer 901 of the first sub-pixel unit P1 is larger than a thickness 904 of the electron injection layer of the fourth sub-pixel unit P4. Therefore, the distance h1 between the corresponding cathode layer 40 of the first sub-pixel unit P1 and the anode layer 201 of the first sub-pixel unit P1 is larger than the fourth distance h4 between the corresponding cathode layer 40 of the fourth sub-pixel unit P4 and the anode layer 204 of the fourth sub-pixel unit P4.

It should be understood that in another embodiment of the present disclosure, it is possible to set that a thickness of the electron transport layer 801 of the first sub-pixel unit P1 is larger than a thickness of the electron transport layer 804 of the fourth sub-pixel unit P4, so that the distance h1 between the corresponding cathode layer 40 of the first sub-pixel unit P1 and the anode layer 201 of the first sub-pixel unit P1 is larger than the fourth distance h4 between the corresponding cathode layer 40 of the fourth sub-pixel unit P4 and the anode layer 204 of the fourth sub-pixel unit P4.

In another embodiment of the present disclosure, it is possible to set that the thickness of the electron injection layer 901 of the first sub-pixel unit P1 is larger than the thickness 904 of the electron injection layer of the fourth sub-pixel unit P4, and that the thickness of the electron transport layer 801 of the first sub-pixel unit P1 is larger than the thickness of the electron transport layer 804 of the fourth sub-pixel unit P4.

It should be understood that in another embodiment of the present disclosure, it is possible to combine adjusting of the electron injection layer and/or the electron transport layer with adjusting of the hole injection layer and/or the hole transport layer, which will not be further described herein.

For an organic light-emitting display panel 100 provided by an embodiment of the present disclosure, at least one of the hole injection layer 60, the hole transport layer 70, the electron transport layer 80, and the electron injection layer 90 of the first sub-pixel unit P1 has a thickness larger than that of at least one of the hole injection layer 60, the hole transport layer 70, the electron transport layer 80, and the electron injection layer 90 of the fourth sub-pixel unit P4. This can improve the chromaticity uniformity of the OLED display panel while reducing the difficulty of the process, thereby reducing the production cost.

Figure 15:
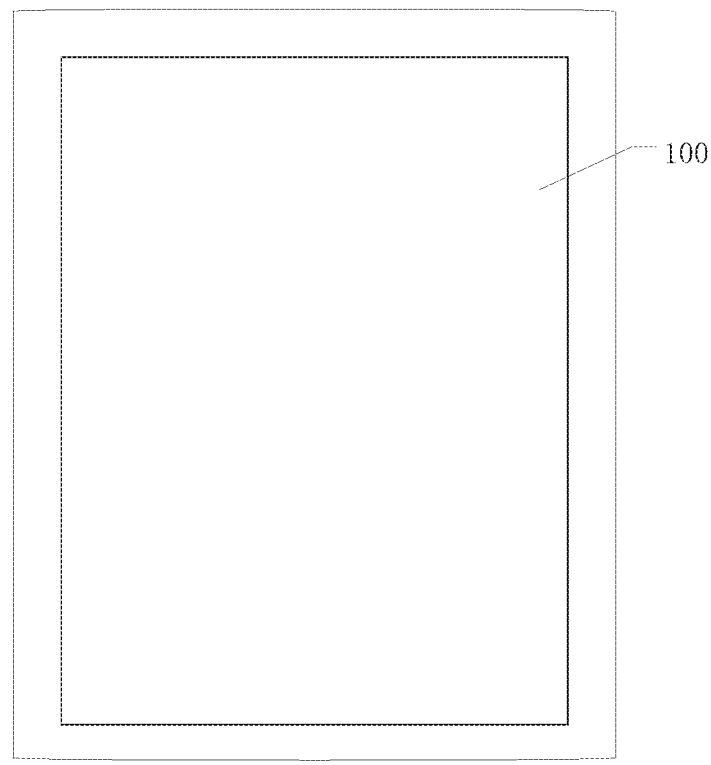
FIG. 15 is a schematic diagram of an electronic device according to an embodiment of the present disclosure.

An embodiment of the present disclosure further provides an electronic device 200. As shown in FIG. 15, the electronic device 200 includes any of the abovementioned organic light-emitting display panels 100 provided by the embodiments of the present disclosure. The electronic device 200 can be any electronic device with a display function, such as a smart phone, a panel display computer, a notebook, a displayer, a television, a window display, etc.

It should be noted that FIG. 15 is only an example of the electronic device 200, and the shape of the electronic device 200 is not limited to the shape or the use state shown in FIG. 15. The electronic device 200 may or may not be rectangular. The electronic device 200 may be a folded display device, a flexible display device, or a rigid display device. The electronic device 200 may be a full-screen display with no border on any side.

An embodiment of the present disclosure provides an electronic device 200 that includes any of the abovementioned organic light-emitting display panels 100 provided by the embodiments of the present disclosure. Therefore, the electronic device 200 provided by this embodiment of the present disclosure has an effect that the abovementioned organic light-emitting display panel 100 provided by the embodiments of the present disclosure can achieve, i.e., compensating for the chromaticity uniformity of the OLED display panel, thereby solving the problem of poor chromaticity uniformity of the OLED display panel in the related art, which would affect the user experience.

An embodiment of the present disclosure provides a method for manufacturing the abovementioned organic light-emitting display panel, which includes following steps.

At S1, a substrate is provided.

At S2, a driving function layer is manufactured on the substrate, and the driving function layer includes a plurality of gate lines, a plurality of data lines, a plurality of pins, and a plurality of electronic components.

At S3, an anode of a light-emitting device of a first sub-pixel unit and an anode of a light-emitting device of a fourth sub-pixel unit are manufactured by using a device mask, and a distance between the first sub-pixel unit and the pins is larger than a distance between the fourth sub-pixel unit and the pins.

At S4, an auxiliary function layer of the light-emitting device of a first sub-pixel unit far from the pins and an auxiliary function layer of the light-emitting device of a fourth sub-pixel unit are manufactured by using a commonly used mask.

At S5, a light-emitting layer of the light-emitting device of the first sub-pixel unit and a light-emitting layer of the light-emitting device of the fourth sub-pixel unit are manufactured by using a device mask.

At S6, another auxiliary function layer of the light-emitting device of the first sub-pixel unit and another auxiliary function layer of the light-emitting device of the fourth sub-pixel unit are manufactured by using a commonly used mask, so that a total thickness of all auxiliary function layers and the light-emitting layer of the light-emitting device of the first sub-pixel unit is larger than a total thickness of all auxiliary function layers and the light-emitting layer of the light-emitting device of the fourth sub-pixel unit.

At S7, a cathode layer is manufactured.

Further, the electronic devices in step S2 can include a thin film transistor.

Further, the following steps may occur between the step S3 and the step S4.

An anode of the light-emitting device of the second sub-pixel unit and an anode of the light-emitting device of the fifth sub-pixel unit are manufactured by using a device mask, and a distance between the second sub-pixel unit and the pins is larger than a distance between the fifth sub-pixel unit and the pins.

An anode of the light-emitting device of the third sub-pixel unit and an anode of the light-emitting device of the sixth sub-pixel unit are manufactured by using a device mask, and a distance between the third sub-pixel unit and the pins is larger than a distance between the sixth sub-pixel unit and the pins.

Further, the step S4 may further include: manufacturing auxiliary function layers of the light-emitting devices of all first sub-pixel units within the first region farther from the pins by means of a commonly used mask by using time of T1, so that the auxiliary function layers of the light-emitting devices of all first sub-pixel units have a same thickness; and manufacturing auxiliary function layers of the light-emitting devices of all fourth sub-pixel units within the second region farther from the pins by means of a commonly used mask by using time of T2, so that the auxiliary function layers of the light-emitting devices of all fourth sub-pixel units have a same thickness. Here, T1 is not equal to T2.

It should be noted that the organic light-emitting display panel can be divided into multiple regions, such as a first region, a second region, . . . , and an $N^{th}$ region (N is a positive integer larger than 1). A distance between the $i^{th}$ region and the pins is larger than a distance between the $(i+1)^{th}$ region and the pins (i is a positive integer smaller than N). Auxiliary function layers of the light-emitting devices of sub-pixel units within the $i^{th}$ region can be simultaneously manufactured by using a commonly used mask. After finishing the manufacturing of the auxiliary function layers of the light-emitting devices of the sub-pixel units within the $i^{th}$ region, auxiliary function layers of the light-emitting devices of all sub-pixel units within a next region can be manufactured by using a commonly used mask. The thickness of the auxiliary function layers of each region can be adjusted by controlling the manufacturing time T.

Further, there are some steps occurring between the step S4 and the step S5, including:

manufacturing a compensation layer of the first sub-pixel unit by using a device mask;

manufacturing a compensation layer of the second sub-pixel unit by using a device mask, where the compensation layer of the first sub-pixel unit is bigger than the compensation layer of the second sub-pixel unit; and manufacturing a compensation layer of the third sub-pixel unit by using a device mask, where the compensation layer of the second sub-pixel unit is bigger than the compensation layer of the third sub-pixel unit.

Further, there are some steps occurring between the step S4 and the step S5, including:

manufacturing a compensation layer of the fourth sub-pixel unit by using a device mask;

manufacturing a compensation layer of the fifth sub-pixel unit by using a device mask, where the compensation layer of the fourth sub-pixel unit is bigger than the compensation layer of the fifth sub-pixel unit; and manufacturing a compensation layer of the sixth sub-pixel unit by using a device mask, where the compensation layer of the fifth sub-pixel unit is bigger than the compensation layer of the sixth sub-pixel unit.

The method for manufacturing the organic light-emitting display panel provided by the embodiments of the present disclosure is applicable to the organic light-emitting display panel provided by the embodiments of the present disclosure, so that the organic light-emitting display panel provided by the embodiments of the present disclosure can achieve compensation for chromaticity unevenness between the first sub-pixel unit and the fourth sub-pixel unit that emit light a same color, and achieve uniformity with respect to the display chromaticity between the first sub-pixel unit and the fourth sub-pixel unit. Therefore, the problem of poor chromaticity uniformity of the organic light-emitting display panel in the related art can be solved.

It should be understood that the abovementioned organic light-emitting display panel, the electronic device and the method for manufacturing organic light-emitting display panel can be implemented in other ways. For example, the above-described embodiments of the organic light-emitting display panel are merely illustrative, are merely embodiments of the present disclosure and are not intended to limit the present disclosure. Any modifications, equivalent substitutions and improvements made within the principle of the present disclosure shall fall into the protection scope of the present disclosure.

What is claimed is:

1. An organic light-emitting display panel, comprising:
   a plurality of gate lines;
   a plurality of data lines intersecting with the plurality of gate lines in an insulation manner;
   a plurality of pins located in a pin region; and
   a plurality of sub-pixel units, each of the plurality of sub-pixel units comprising a cathode layer;
   an anode layer; and a light-emitting layer located between the cathode layer and the anode layer;
   wherein the plurality of sub-pixel units comprises a first sub-pixel unit, a second sub-pixel unit, a third sub-pixel unit, a fourth sub-pixel unit, a fifth sub-pixel unit, and a sixth sub-pixel unit, wherein the first sub-pixel unit, the second sub-pixel unit and the third sub-pixel unit emit light with different colors, and the fourth sub-pixel unit, the fifth sub-pixel unit and the sixth sub-pixel unit emit light with different colors;
   wherein the first sub-pixel unit and the fourth sub-pixel unit emit light with a same color, and a distance between the first sub-pixel unit and the pin region is larger than a distance between the fourth sub-pixel unit and the pin region; and
   wherein a distance between the cathode layer of the first sub-pixel unit and the anode layer of the first sub-pixel unit is a first distance, a distance between the cathode layer of the fourth sub-pixel unit and the anode layer of the fourth sub-pixel unit is a fourth distance, and the first distance is larger than the fourth distance.

2. The organic light-emitting display panel according to claim 1, wherein the second sub-pixel unit and the fifth sub-pixel unit emit light with a same color, and a distance between the second sub-pixel unit and the pin region is larger than a distance between the fifth sub-pixel unit and the pin region;
   a distance between the cathode layer of the second sub-pixel unit and the anode layer of the second sub-pixel unit is a second distance, a distance between the cathode layer of the fifth sub-pixel unit and the anode layer of the fifth sub-pixel unit is a fifth distance, and the second distance is larger than the fifth distance.

3. The organic light-emitting display panel according to claim 2, wherein the third sub-pixel unit and the sixth sub-pixel unit emit light with a same color, and a distance between the third sub-pixel unit and the pin region is larger than a distance between the sixth sub-pixel unit and the pin region;
   a distance between the cathode layer of the third sub-pixel unit and the anode layer of the third sub-pixel unit is a third distance, a distance between the cathode layer of the sixth sub-pixel unit and the anode layer of the sixth sub-pixel unit is a sixth distance, and the third distance is larger than the sixth distance.

4. The organic light-emitting display panel according to claim 1, wherein the organic light-emitting display panel has a first region and a second region, and a distance between the first region and the pin region is larger than a distance between the second region and the pin region;
   the first sub-pixel unit, the second sub-pixel unit and the third sub-pixel unit are located within the first region;
   the fourth sub-pixel unit, the fifth sub-pixel unit and the sixth sub-pixel unit are located within the second region;
   in the first region, the first sub-pixel unit has a same first distance; and
   in the second region, the fourth sub-pixel unit has a same fourth distance.

5. The organic light-emitting display panel according to claim 4, wherein within the first region,
   the distance between the cathode layer of the first sub-pixel unit and the anode layer of the first sub-pixel unit is larger than the distance between the cathode layer of the second sub-pixel unit and the anode layer of the second sub-pixel unit; and
   the distance between the cathode layer of the second sub-pixel unit and the anode layer of the second sub-pixel unit is larger than the distance between the cathode layer of the third sub-pixel unit and the anode layer of the third sub-pixel unit.

6. The organic light-emitting display panel according to claim 5, wherein each of the plurality of sub-pixel units comprises a compensation layer located between the light-emitting layer and the anode layer,
   within the first region, a thickness of the compensation layer of the first sub-pixel unit is larger than a thickness of the compensation layer of the second sub-pixel unit, and the thickness of the compensation layer of the second sub-pixel unit is larger than a thickness of the compensation layer of the third sub-pixel unit.

7. The organic light-emitting display panel according to claim 4, wherein within the first region,
   the cathode layer of the second sub-pixel unit has a same distance from the anode layer of the second sub-pixel unit, and
   the cathode layer of the third sub-pixel unit has a same distance from the anode layer of the third sub-pixel unit.

8. The organic light-emitting display panel according to claim 4, wherein within the second region,
   the distance between the cathode layer of the fourth sub-pixel unit and the anode layer of the fourth sub-pixel unit is larger than the distance between the cathode layer of the fifth sub-pixel unit and the anode layer of the fifth sub-pixel unit; and
   the distance between the cathode layer of the fifth sub-pixel unit and the anode layer of the fifth sub-pixel unit is larger than the distance between the cathode layer of the sixth sub-pixel unit and the anode layer of the sixth sub-pixel unit.

9. The organic light-emitting display panel according to claim 8, wherein each of the plurality of sub-pixel units comprises a compensation layer located between the light-emitting layer and the anode layer, and
   within the second region, a thickness of the compensation layer of the fourth sub-pixel unit is larger than a thickness of the compensation layer of the fifth sub-pixel unit, and the thickness of the compensation layer of the fifth sub-pixel unit is larger than a thickness of the compensation layer of the sixth sub-pixel unit.

10. The organic light-emitting display panel according to claim 4, wherein within the second region,
    the cathode layer of the at least one fifth sub-pixel unit has a same distance from the anode layer of the fifth sub-pixel unit, and
    the cathode layer of the sixth sub-pixel unit as a same distance from the anode layer of the sixth sub-pixel unit.

11. The organic light-emitting display panel according to claim 1, wherein each of the plurality of sub-pixel units comprises:
    a hole injection layer located between the anode layer and the light-emitting layer; and
    a hole transport layer located between the hole injection layer and the light-emitting layer, wherein a thickness of the hole injection layer of the first sub-pixel unit is larger than a thickness of the hole injection layer of the fourth sub-pixel unit, and/or a thickness of the hole transport layer of the first sub-pixel unit is larger than a thickness of the hole transport layer of the fourth sub-pixel unit.

12. The organic light-emitting display panel according to claim 1, wherein each of the plurality of sub-pixel units comprises:
   an electron injection layer located between the cathode layer and the light-emitting layer; and
   an electron transport layer located between the hole injection layer and the light-emitting layer,
   wherein a thickness of the electron injection layer of the first sub-pixel unit is larger than a thickness of the electron injection layer of the fourth sub-pixel unit, and/or a thickness of the electron transport layer of the first sub-pixel unit is larger than a thickness of the electron transport layer of the fourth sub-pixel unit.

13. An electronic device, comprising:
   an organic light-emitting display panel, wherein the organic light-emitting display panel comprises:
   a plurality of gate lines;
   a plurality of data lines intersecting with the plurality of gate lines in an insulation manner;
   a plurality of pins located in a pin region; and
   a plurality of sub-pixel units, each of the plurality of sub-pixel units comprising a cathode layer; an anode layer; and a light-emitting layer located between the cathode layer and the anode layer;
   wherein the plurality of sub-pixel units comprises a first sub-pixel unit, a second sub-pixel unit, a third sub-pixel unit, a fourth sub-pixel unit, a fifth sub-pixel unit, and a sixth sub-pixel unit, wherein the first sub-pixel unit, the second sub-pixel unit and the third sub-pixel unit emit light with different colors, and the fourth sub-pixel unit, the fifth sub-pixel unit and the sixth sub-pixel unit emit light with different colors;
   wherein the first sub-pixel unit and the fourth sub-pixel unit emit light with a same color, and a distance between the first sub-pixel unit and the pin region is larger than a distance between the fourth sub-pixel unit and the pin region; and
   wherein a distance between the cathode layer of the first sub-pixel unit and the anode layer of the first sub-pixel unit is a first distance, a distance between the cathode layer of the fourth sub-pixel unit and the anode layer of the fourth sub-pixel unit is a fourth distance, and the first distance is larger than the fourth distance.

\* \* \* \* \*